US012550705B2

(12) United States Patent
Kang et al.

(10) Patent No.: US 12,550,705 B2
(45) Date of Patent: Feb. 10, 2026

(54) SELF-ALIGNED BACKSIDE GATE CONTACT

(71) Applicant: INTERNATIONAL BUSINESS MACHINES CORPORATION, Armonk, NY (US)

(72) Inventors: Tsung-Sheng Kang, Ballston Lake, NY (US); Alexander Reznicek, Troy, NY (US); Tushar Gupta, Albany, NY (US); Sagarika Mukesh, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 593 days.

(21) Appl. No.: 18/057,888

(22) Filed: Nov. 22, 2022

(65) Prior Publication Data

US 2024/0170369 A1    May 23, 2024

(51) Int. Cl.
*H01L 23/48* (2006.01)
*H01L 21/762* (2006.01)
*H10D 84/01* (2025.01)
*H10D 84/03* (2025.01)
*H10D 84/85* (2025.01)

(52) U.S. Cl.
CPC ...... *H01L 23/481* (2013.01); *H01L 21/76224* (2013.01); *H10D 84/0186* (2025.01); *H10D 84/0188* (2025.01); *H10D 84/038* (2025.01); *H10D 84/853* (2025.01)

(58) Field of Classification Search
CPC .... H10D 84/83; H10D 84/85; H10D 84/0149; H10D 84/0151
See application file for complete search history.

(56) References Cited

U.S. PATENT DOCUMENTS

| | | |
|---|---|---|
| 11,257,764 B2 | 2/2022 | Hiblot et al. |
| 11,335,606 B2 | 5/2022 | Yang et al. |
| 2020/0266169 A1 | 8/2020 | Kang et al. |
| 2020/0294998 A1 | 9/2020 | Lilak et al. |
| 2020/0373242 A1 | 11/2020 | Hiblot et al. |
| 2021/0343578 A1 | 11/2021 | Chang et al. |
| 2021/0407999 A1 | 12/2021 | Huang et al. |
| 2022/0139911 A1 | 5/2022 | Wei et al. |
| 2022/0165733 A1 | 5/2022 | Chen et al. |
| 2023/0012147 A1* | 1/2023 | Chu ............ H10D 30/43 |
| 2024/0096790 A1* | 3/2024 | Badaroglu ......... H10D 84/83 |

* cited by examiner

*Primary Examiner* — Fernando L Toledo
*Assistant Examiner* — Adam S Bowen
(74) *Attorney, Agent, or Firm* — CANTOR COLBURN LLP; Kimberly Zillig

(57) ABSTRACT

A semiconductor device is provided. The semiconductor device includes a first field effect transistor (FET) region, a second FET region and a backside signal distribution network (BSSDN). The first FET region includes a substrate, interlayer dielectric (ILD), shallow trench isolation (STI) disposed in the substrate and a contact that extends through the STI and the ILD. The second FET region includes a substrate, interlayer dielectric (ILD), shallow trench isolation (STI) disposed in the substrate and a contact that extends to the STI. The BSSDN is disposed on the ILD in the first and second regions to contact with the contact in the first FET region.

19 Claims, 6 Drawing Sheets

SELF-ALIGNED BACKSIDE GATE CONTACT

BACKGROUND

The present invention generally relates to fabrication methods and resulting structures for semiconductor devices. More specifically, the present invention relates to a semiconductor device with a self-aligned backside gate contact.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

SUMMARY

Embodiments of the invention are directed to a semiconductor device. A non-limiting example of the semiconductor device includes a first field effect transistor (FET) region, a second FET region and a backside signal distribution network (BSSDN). The first FET region includes a substrate, interlayer dielectric (ILD), shallow trench isolation (STI) disposed in the substrate and a contact that extends through the STI and the ILD. The second FET region includes a substrate, interlayer dielectric (ILD), shallow trench isolation (STI) disposed in the substrate and a contact that extends to the STI. The BSSDN is disposed on the ILD in the first and second regions to contact with the contact in the first FET region.

Embodiments of the present invention are directed to a method of semiconductor device fabrication. A non-limiting example of the method includes assembling first and second field effect transistor (FET) regions that each include shallow trench isolation (STI) recessed into a substrate, stacks of alternating semiconductor materials and bottom dielectric isolation (BDI) on the substrate aside the STI and gate dielectric on the STI and between the stacks. The non-limiting example of the method also includes forming a first opening through the gate dielectric to the STI in the second FET region, forming a second opening through the gate dielectric and the STI and into the substrate in the first FET region, filling the first and second openings with first and second dielectric material, respectively, exposing the second dielectric material through the substrate and replacing the second dielectric material, which is exposed, with metal.

Embodiments of the present invention are directed to a method of semiconductor device fabrication. A non-limiting example of the method includes assembling first and second field effect transistor (FET) regions that each include shallow trench isolation (STI) recessed into a substrate, stacks of alternating semiconductor materials and bottom dielectric isolation (BDI) on the substrate aside the STI and gate dielectric on the STI and between the stacks. The non-limiting example of the method also includes forming openings through the gate dielectric to the STI in the first and second FET regions, filling the openings with dielectric material, lithographically removing the dielectric material from the opening in the first FET region and filling the opening in the first FET with metal.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
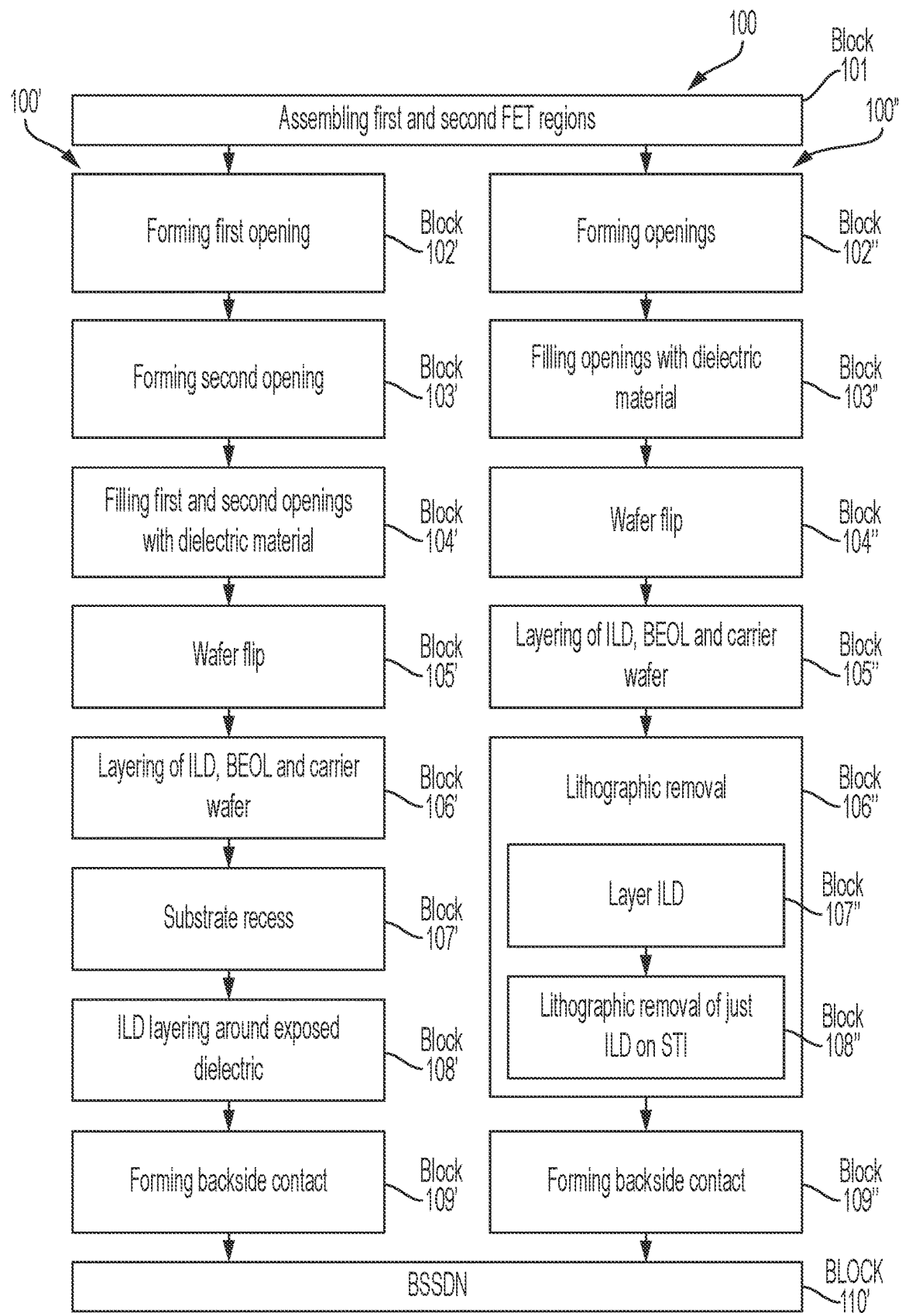
FIG. 1 is a flow diagram illustrating alternative methods of semiconductor device fabrication each in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a field effect transistor (FET) typically has a source, a channel and a drain where current flows from the source to the drain as well as a gate that controls the flow of current through the device channel. FETs can have a variety of different structures. For example, FETs have been fabricated with the source, channel and drain formed in a substrate material itself, where the current flows horizontally (i.e., in the plane of the substrate). As another example, FinFETs have been formed with the channel extending outwardly from the substrate, but where the current also flows horizontally from the source to the drain. The channel for the FinFET can be an upright slab of thin rectangular silicon (Si), commonly referred to as the fin with a gate on the fin, as compared to a metal-oxide-semiconductor FET (MOSFET) with a single gate parallel with the plane of the substrate. Depending on doping of the source and drain, an n-doped FET (nFET) or a p-doped FET (pFET) can be formed. Two FETs also can be coupled to form a complementary metal-oxide-semiconductor (CMOS) device, where a p-channel MOSFET and n-channel MOSFET are coupled together.

In certain logic circuits in which FETs are employed, it is often the case that an nFET and a pFET will have their respective gates connected to each other. This has been previously achieved by placement of a gate cut between the nFET and the pFET and then re-connecting them using one of the contacts. Doing so requires extra space in an overall integrated circuit (IC) design and thus results in a non-optimal configuration.

A need therefore remains for a backside contact (CB) that is shared between an nFET and a pFET and that is compatible with a self-aligned scheme.

Turning now to an overview of the aspects of the invention, one or more embodiments of the invention address the above-described shortcomings of the prior art by providing a semiconductor device in which a backside contact (CB) is shared between gates of two FETs and extends across shallow trench isolation (STI) and backside interlayer dielectric (ILD). The backside contact may or may not extend between residual STI and has a continuous profile from a frontside ILD to a backside ILD.

The above-described aspects of the invention address the shortcomings of the prior art by providing for a semiconductor device that has a characteristically large contact area, that exhibits self-alignment for a backside contact (CB) and does not require extra space for a gate cut.

Turning now to a more detailed description of aspects of the present invention, FIG. 1 depicts alternative methods of semiconductor device fabrication 100 each according to one or more embodiments of the present invention.

The alternative methods of semiconductor device fabrication 100 include assembling first and second field effect transistor (FET) regions (block 101). Each of the first and second FET regions initially includes STI that is recessed into a first portion of a substrate, stacks of alternating semiconductor materials (silicon and silicon-germanium) and bottom dielectric isolation (BDI) on an upper surface of the substrate and at either side of the STI and gate dielectric that is disposed on an upper surface of the STI and that is interposed between and atop the stacks.

In one of the alternative methods of the semiconductor device fabrication 100', a first opening is formed through the gate dielectric to the STI in the second FET region (block 102'), a second opening is formed through the gate dielectric and the STI and into the substrate in the first FET region (block 103') and the first and second openings are filled with first and second dielectric material, respectively (block 104'). Following a wafer flip operation (block 105'), ILD and back-end-of-line (BEOL) structures and a carrier substrate are layered to the first and second FET regions opposite the substrate (block 106'). A portion of the second dielectric material is then exposed through the substrate by a process of substrate recession at a second portion of the substrate which is opposite the first portion (block 107'). Next, ILD is layered on the substrate and the STI in the second FET region and on the substrate and the STI and around the portion of the second dielectric material that is exposed in the first FET region (block 108'). The portion of the second dielectric material, which is exposed and surrounded by the ILD, is replaced with metal in a self-aligning manner to form a backside contact (block 109'). This backside contact may or may not extend through residual STI. In cases when the backside contact does extend through the residual STI, the residual STI effectively serves as a contact spacer. A backside signal distribution network (BSSDN) is then applied to the ILD in the first and second FET regions to contact the metal of the backside contact in the first FET region (block 110').

The backside contact has a continuous profile from the ILD at the frontside to the ILD at the backside. In addition, the BSSDN thus makes it possible for the backside contact, which is shared between the first and second FET regions, to effectively extend across the ILD in both the first and second FET regions.

In another one of the alternative methods of the semiconductor device fabrication 100", openings are formed through the gate dielectric to the STI in the first and second FET regions (block 102") and these openings are filled with dielectric material (block 103"). Following a wafer flip operation (block 104"), ILD and back-end-of-line (BEOL) structures and a carrier substrate are layered to the first and second FET regions opposite the substrate (block 105"). The dielectric material is then lithographically removed from the opening in the first FET region (block 106") by layering ILD on the substrate and the STI in the first and second FET regions (block 107") and subsequently lithographically removing just the ILD on the STI in the first FET region (block 108"). The resulting opening in the first FET region is filled with metal to form a backside contact (block 109"). This backside contact may or may not extend through residual STI. In cases when the backside contact does extend through the residual STI, the residual STI effectively serves as a contact spacer. A backside signal distribution network (BSSDN) is then applied to the ILD in the first and second FET regions to contact the metal of the backside contact in the first FET region (block 110').

The backside contact has a continuous profile from the ILD at the frontside to the ILD at the backside. In addition, the BSSDN thus makes it possible for the backside contact, which is shared between the first and second FET regions, to effectively extend across the ILD in both the first and second FET regions.

In accordance with one or more embodiments of the present invention, the first FET region can be characterized in that its gate dielectric is interposed between an n-doped FET (nFET) stack and a p-doped FET (pFET) stack and the second FET region can be characterized in that the gate dielectric is between the pFET stack and another nFET stack. In accordance with one or more additional embodiments of the present invention, two first FET regions are provided, of which one is characterized in that the gate dielectric is between nFET stacks and the other is characterized in that the gate dielectric is between pFET stacks, and multiple second FET regions are provided, of which one is characterized in that the gate dielectric is between an nFET stack and a pFET stack. The one of the multiple second FET regions can be between the two first FET regions.

With reference to FIGS. 2-9, the alternative methods of the semiconductor device fabrication 100' (FIGS. 3-6 and FIG. 7) and 100" (FIGS. 8 and 9 and FIG. 7) of the method of semiconductor device fabrication 100 of FIG. 1 will now be described in greater detail.

Figure 2:
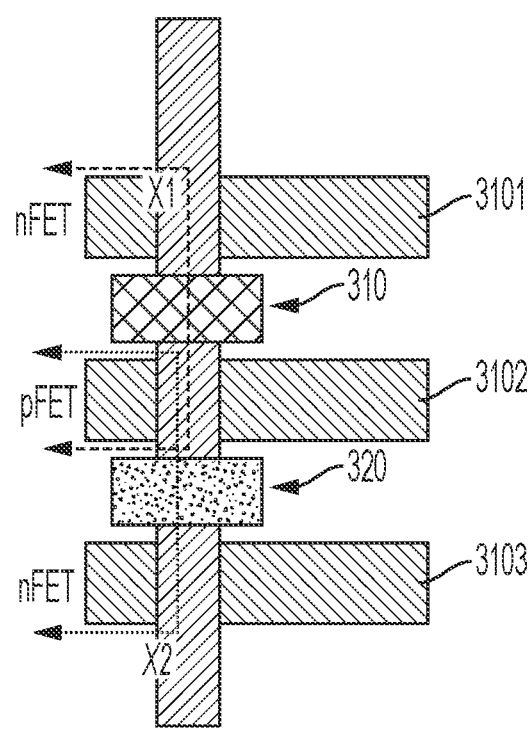
FIG. 2 depicts a top-down view of a semiconductor device according to one or more embodiments of the present invention.

FIG. 2 depicts a top-down view of the semiconductor device being fabricated. For reference, the X1 cross-sectional view of FIG. 2 corresponds to the perspective of the images in the left-sides of FIGS. 3-8 and FIG. 9 and the Y1 cross-sectional view of FIG. 2 corresponds to the perspective of the images in the right-sides of FIGS. 3-8. FIGS. 10 and 11 are similarly oriented as FIG. 2.

Figure 3:
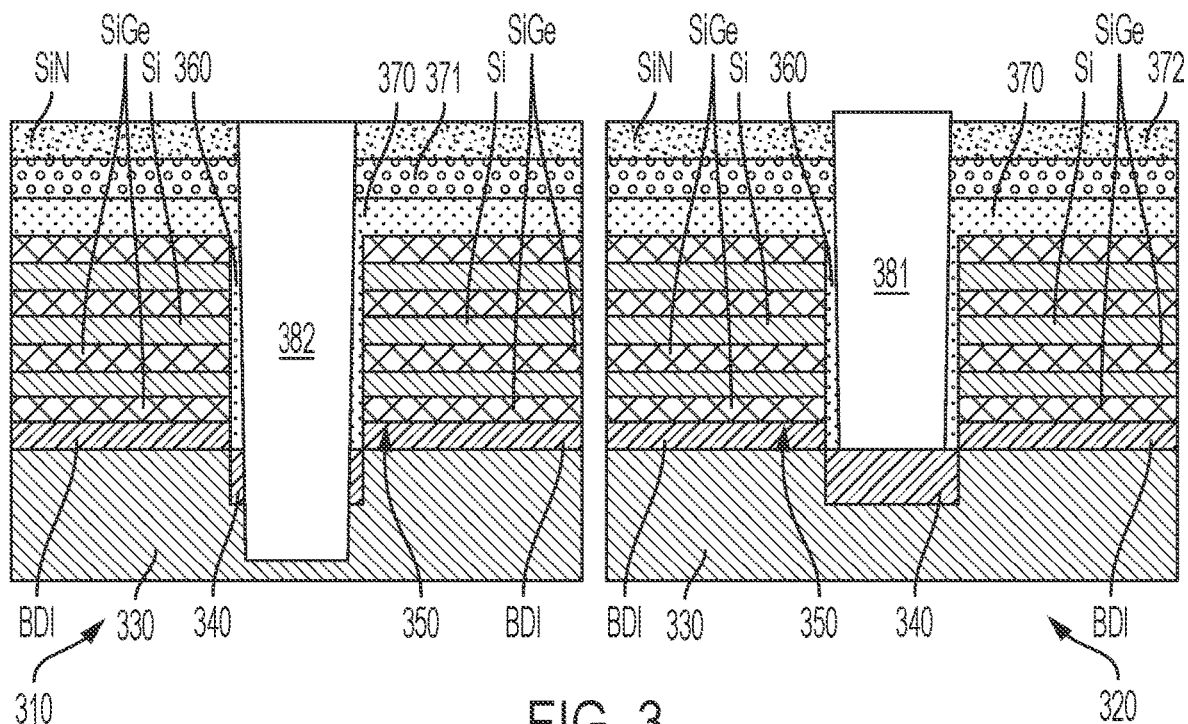
FIG. 3 depicts a plan view of the semiconductor device of FIG. 2 at an initial stage of assembly in accordance with one or more embodiments of the present invention.

As shown in FIG. 3, at an initial stage of assembly of the semiconductor device, first and second FET regions 310 and 320 are assembled. Each of the first and second FET regions includes a substrate 330, which can be formed of silicon or another similar semiconductor material, STI 340 that is recessed into an upper portion of the substrate 330, stacks 350 of alternating semiconductor materials, such as silicon and silicon-germanium for example, and BDI that are disposed on an upper surface of the substrate 330 and at either side of the STI 340 and gate dielectric 360. The gate dielectric 360 is disposed on an upper surface of the STI 340 and is interposed between the stacks 350. An additional layer 370 of the gate dielectric 360 can be disposed on upper surfaces of the stacks 350. A hardmask layer 371 and a dielectric layer 372, such as silicon-nitride, can be layered on the additional layer 370 of the gate dielectric 360.

In accordance with one or more embodiments of the present invention and as shown in FIG. 2, the first FET region 310 can be characterized in that its gate dielectric (initial) is interposed between an nFET stack 3101 and a pFET stack 3102 and the second FET region 320 can be characterized in that its gate dielectric (initial) is between the pFET stack 3102 and another nFET stack 3103.

As is also shown in FIG. 3, a first opening 381 is formed through the dielectric layer 372, the hardmask layer 371 and the gate dielectric 360 to the upper surface of the STI 340 in the second FET region 320 and a second opening 382 is formed through the dielectric layer 372, the hardmask layer 371, the gate dielectric 360 and the STI 340 and into and partially through the substrate 330 in the first FET region 310. This can be done by reactive ion etching (RIE) or another similar process and patterning.

Figure 4:
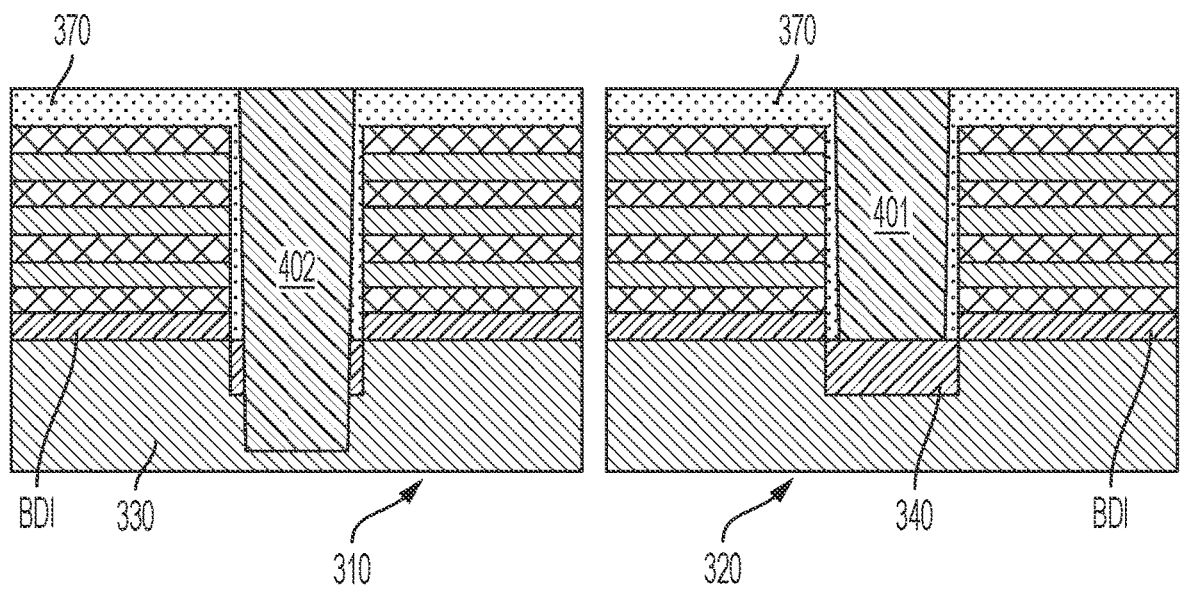
FIG. 4 depicts a plan view of the semiconductor device of FIG. 3 following dielectric fill in accordance with one or more embodiments of the present invention.

As shown in FIG. 4, the first opening 381 (see FIG. 3) is filled with first dielectric material 401 that terminates at the upper surface of the STI 340 and the second opening 382 (see FIG. 3) is filled with second dielectric material 402 that terminates in an interior of the substrate 330. A process of chemical mechanical polishing (CMP) or another similar process is then executed to remove the dielectric layer 372 (see FIG. 3) and the hardmask layer 371 (see FIG. 3) and to planarize the uppermost surfaces of the additional layer 370 of the dielectric material of the gate dielectric 360 (see FIG. 3) and the first and second dielectric materials 401 and 402.

Figure 5:
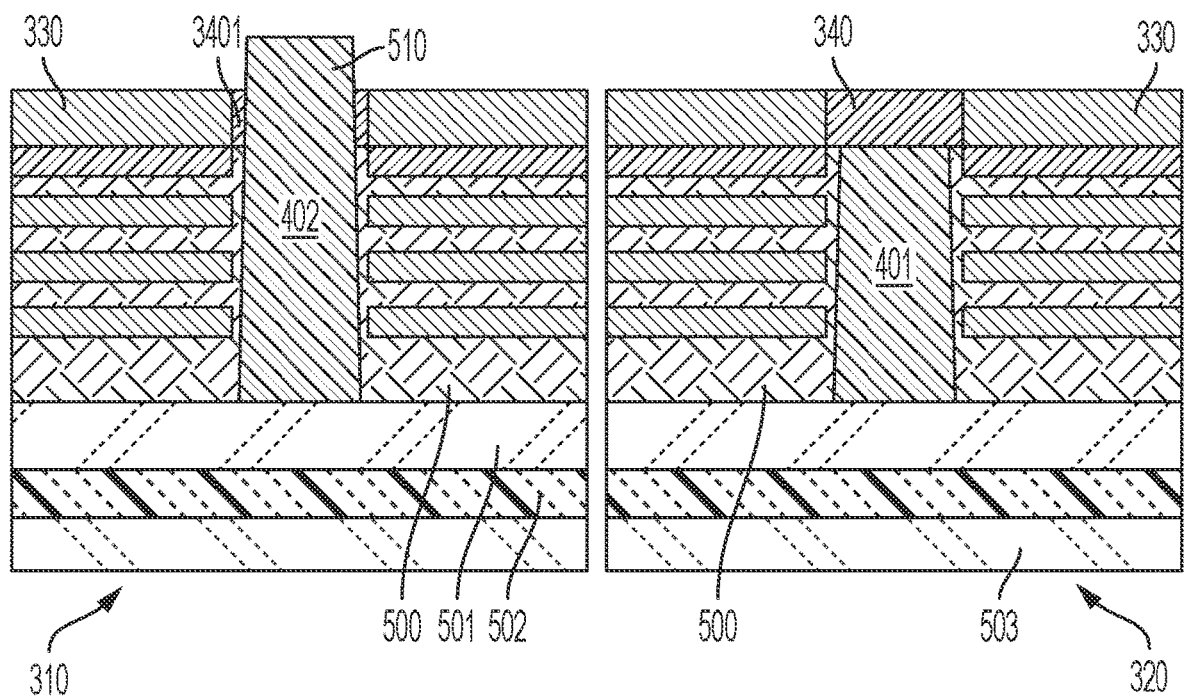
FIG. 5 depicts a plan view of the semiconductor device of FIG. 4 following a wafer flip, an addition of frontside layering and substrate recession in accordance with one or more embodiments of the present invention.

As shown in FIG. 5, one of the semiconductor materials in the stacks 350 (i.e., the silicon-germanium) and the gate dielectric 360 are replaced by replacement metal gate material (RMG) 500.

As is also shown in FIG. 5, a wafer flip operation is executed to flip the first and second FET regions 310 and 320 and ILD 501 and back-end-of-line (BEOL) structures 502 and a carrier substrate 503 are layered to the first and second FET regions 310 and 320 opposite the substrate 330. A portion 510 of the second dielectric material 402 is then exposed through the substrate 330 by a process of substrate recession at a second portion of the substrate 330 which is opposite the first portion.

Figure 6:
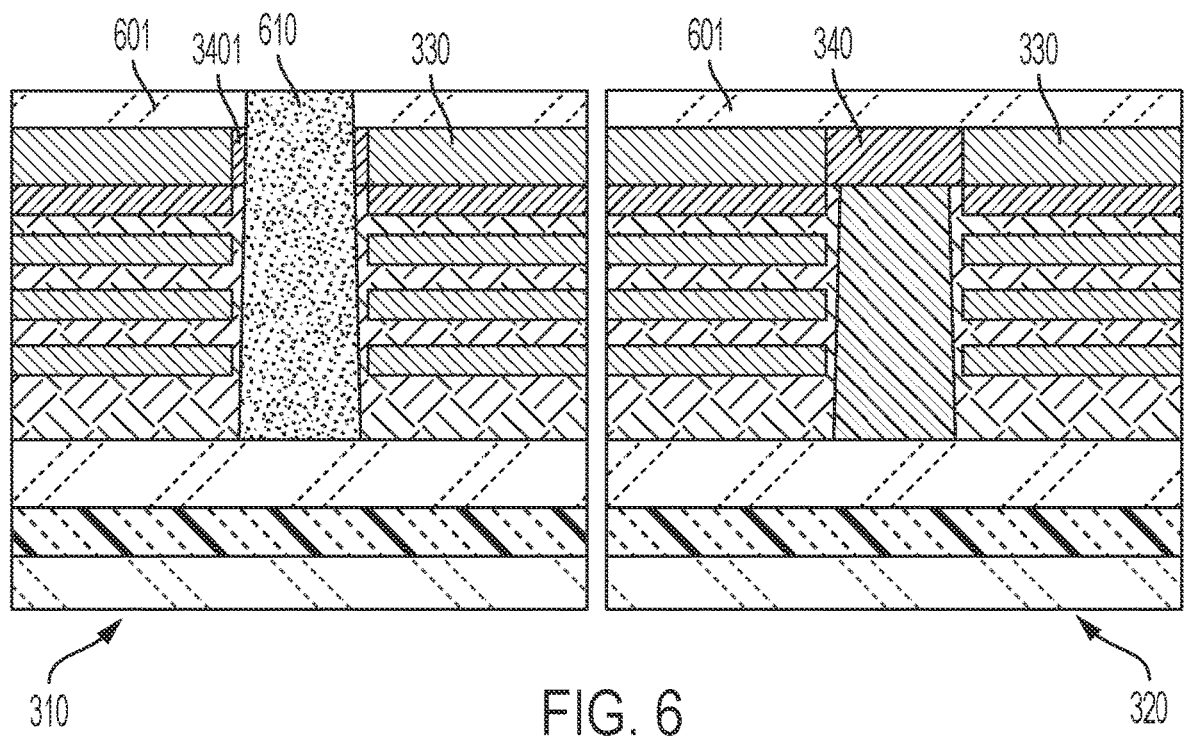
FIG. 6 depicts a plan view of the semiconductor device of FIG. 5 following dielectric replacement by metal in accordance with one or more embodiments of the present invention.

As shown in FIG. 6, ILD 601 is layered on the substrate 330 and the STI 340 in the second FET region 320 and on the substrate 330 and the STI 340 and around the portion 510 (see FIG. 5) of the second dielectric material 402 (see FIG. 5), which is exposed through the recessed substrate 330 in the first FET region 310. The ILD 601 and the portion 510 of the second dielectric material 402 are then planarized by CMP or another similar process. The second dielectric material 402 (including the portion 510) is then removed as part of a self-alignment scheme and subsequently replaced with metal in a self-aligning manner to form a backside contact 610. This backside contact 610 may or may not extend through residual STI. In cases when the backside contact 610 does extend through the residual STI, the residual STI effectively serves as a contact spacer 3401.

Figure 7:
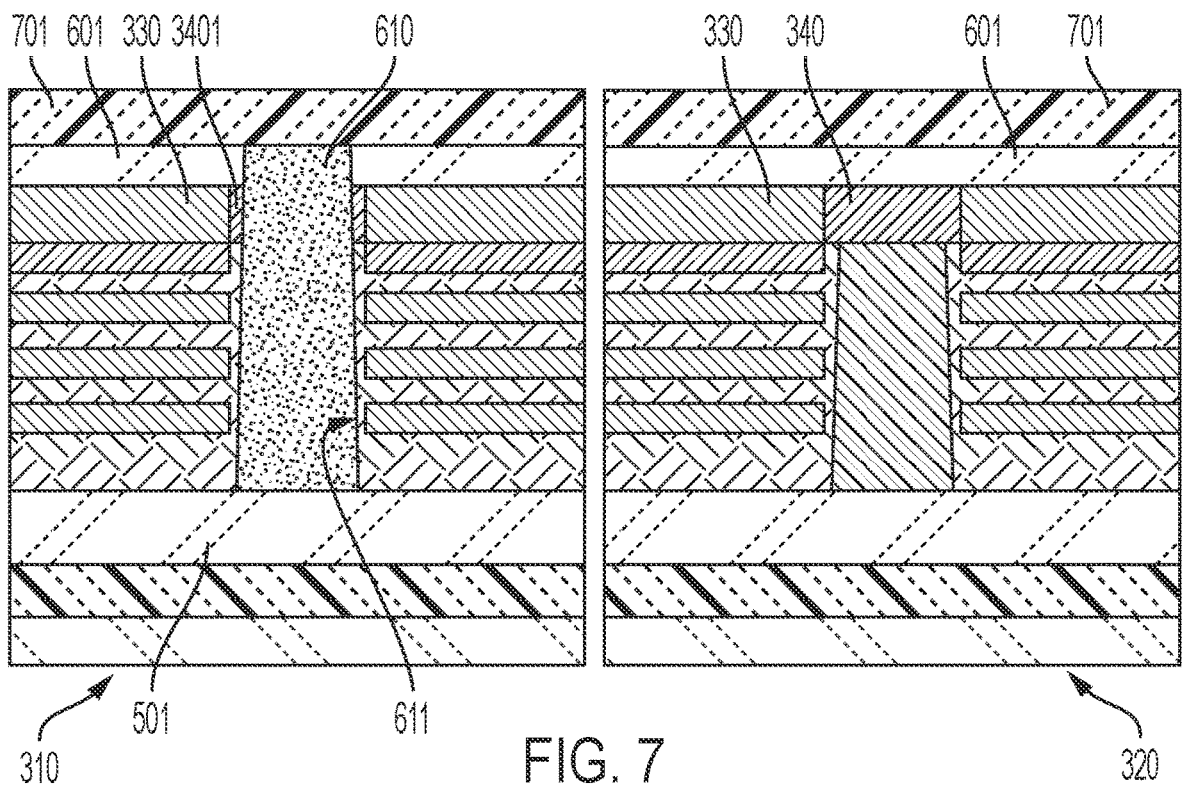
FIG. 7 depicts a plan view of a final structure of the semiconductor device of FIGS. 3-5 in accordance with one or more embodiments of the present invention.

As shown in FIG. 7, a BSSDN 701 is then applied to the ILD 601 in the first and second FET regions 310 and 320 to contact the metal of the backside contact 610 in the first FET region 310. The backside contact 610 has a continuous profile 611 from the ILD 501 at the frontside to the ILD 601 at the backside which arises due to an entirety of the backside contact 610 being formed at a same time. In addition, the BSSDN 701 makes it possible for the backside contact 610, which is shared between the first and second FET regions 310 and 320, to effectively extend across the ILD 601 in both the first and second FET regions 310 and 320.

Figure 8:
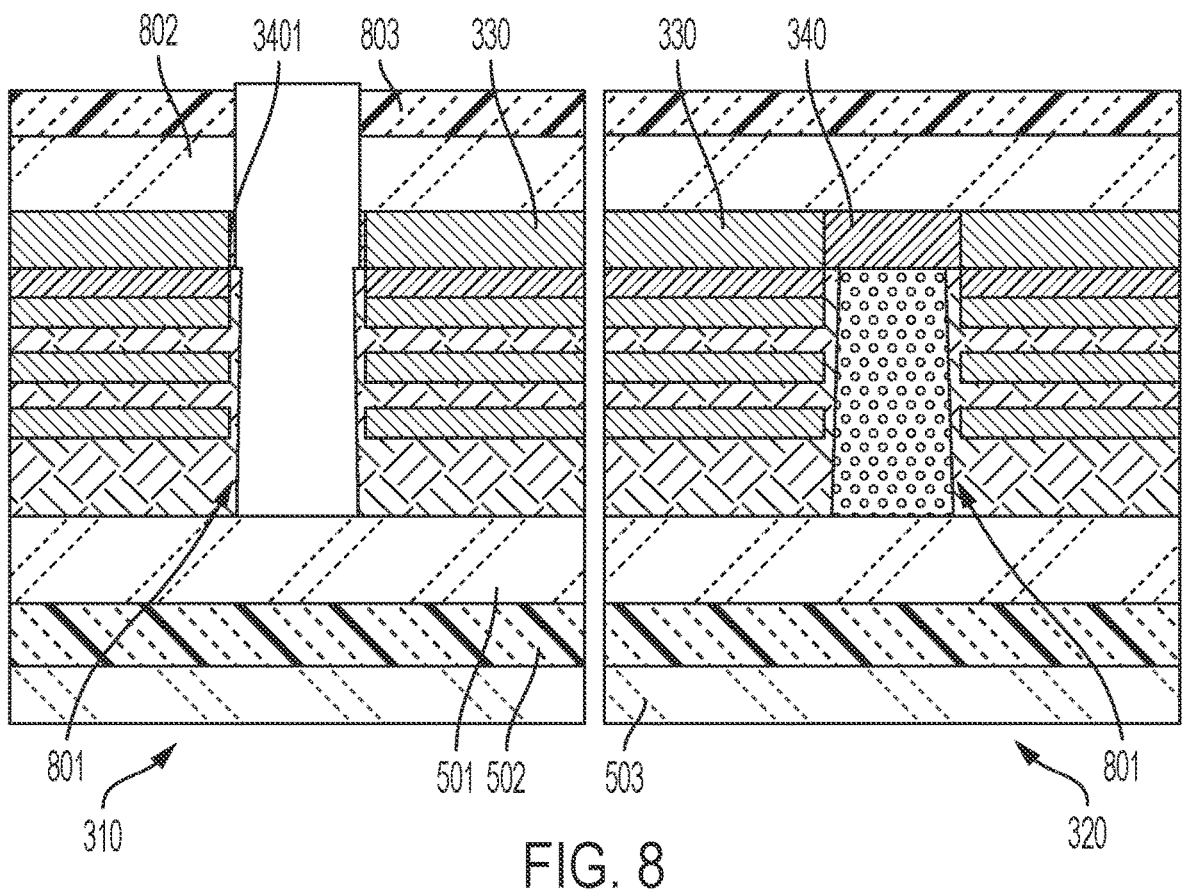
FIG. 8 depicts a plan view of the semiconductor device of FIG. 2 following an alternative process in preparation of a lithographic removal of dielectric in accordance with one or more embodiments of the present invention.

As shown in FIG. 8, openings 801 are both formed through the dielectric layer 372 (see FIG. 3), the hardmask layer 371 (see FIG. 3) and the gate dielectric 360 (see FIG. 3) to the upper surface of the STI 340 in both the first and second FET regions 310 and 320. These openings are initially filled with dielectric material. Following RMG replacement (see FIG. 5), a wafer flip operation is executed to flip the first and second FET regions 310 and 320 and ILD 501 (see FIG. 5) and BEOL structures 502 (see FIG. 5) and a carrier substrate 503 (see FIG. 5) are layered to the first and second FET regions 310 and 320 opposite the substrate 330. The dielectric material filling the opening 801 in the first FET region 310 is then lithographically removed from the opening 801 in the first FET region 310. This lithographic removal is accomplished by layering ILD 802 on the substrate 330 and the STI 340 in the first and second FET regions 310 and 320 and subsequently lithographically removing just the ILD 802 that is disposed on the STI 340 in the first FET region 310 via an opening in a lithographic mask layer 803. Subsequently, a portion of the STI 340 is removed along with the dielectric material filling the opening 801 in the first FET region 310 to form a resulting opening 810.

Figure 9:
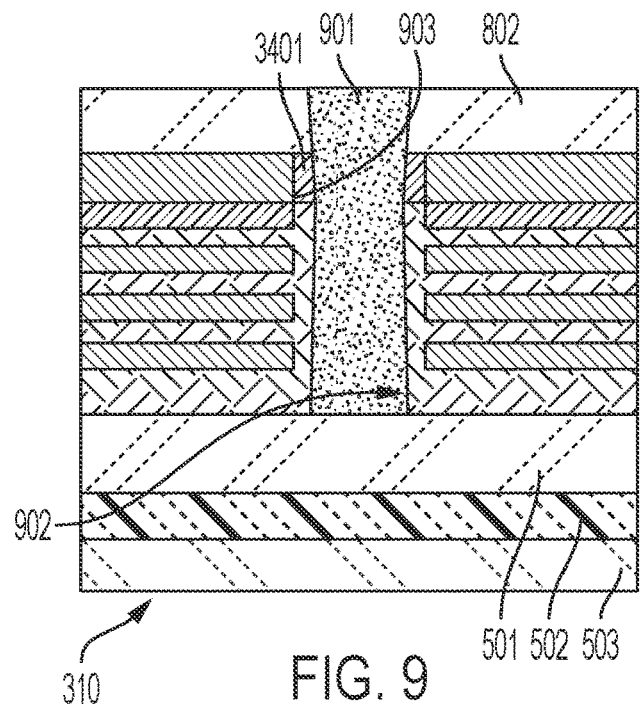
FIG. 9 depicts a plan view of the semiconductor device of FIG. 8 following lithographic dielectric removal and replacement with metal in accordance with one or more embodiments of the present invention.
Figure 10:
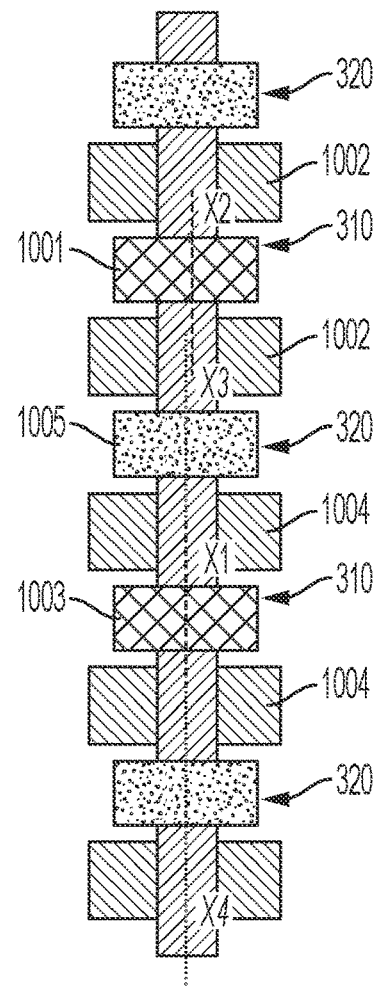
FIG. 10 depicts a top-down view of a semiconductor device according to one or more additional embodiments of the present invention.

As shown in FIG. 9, the resulting opening 810 in the first FET region 310 is filled with metal to form a backside contact 901. This backside contact 901 may or may not extend through residual STI 340. In cases when the backside contact 901 does extend through the residual STI, the residual STI effectively serves as a contact spacer 3401. The BSSDN 701 (see FIG. 7) is then applied to the ILD 802 in the first and second FET regions 310 and 320 to contact the metal of the backside contact 901 in the first FET region 310. The backside contact 901 has a discontinuous continuous profile 902 from the ILD 501 at the frontside to the ILD 802 at the backside that includes an angular portion 903 which results from the backside contact 901 being formed in stages. In addition, as noted above, the BSSDN 701 makes it possible for the backside contact 901, which is shared between the first and second FET regions 310 and 320, to effectively extend across the ILD 802 in both the first and second FET regions 310 and 320.

With reference to FIG. 10 and, in accordance with one or more additional embodiments of the present invention, two first FET regions 310 are provided, of which one 1001 is characterized in that the gate dielectric (initial) is between nFET stacks 1002 and the other 1003 is characterized in that the gate dielectric (initial) is between pFET stacks 1004, and multiple second FET regions 320 are provided, of which one 1005 is characterized in that the gate dielectric (initial) is between an nFET stack 1002 and a pFET stack 1004. The one of the multiple second FET regions 1005 can be interposed between the two first FET regions 1001 and 1003.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device, comprising:
   a first field effect transistor (FET) region comprising a substrate, interlayer dielectric (ILD), shallow trench isolation (STI) disposed in the substrate and a contact that extends through the STI and the ILD;
   a second FET region comprising a substrate, interlayer dielectric (ILD), shallow trench isolation (STI) disposed in the substrate and a contact that extends to the STI; and
   a backside signal distribution network (BSSDN) disposed on the ILD in the first and second regions to contact with the contact in the first FET region,
   wherein:
   two first FET regions are provided, of which one is characterized in that the contact is between n-doped FET (nFET) stacks and the other is characterized in that the contact is between p-doped FET (pFET) stacks, and
   multiple second FET regions are provided, of which one, which is between the two first FET regions, is characterized in that the contact is between an nFET stack and a pFET stack.

2. The semiconductor device according to claim 1, wherein the contact in the first FET region has a continuous profile from a frontside thereof to a backside thereof.

3. The semiconductor device according to claim 1, wherein the contact in the first FET region has a discontinuous profile from a frontside thereof to a backside thereof including an angular portion.

4. The semiconductor device according to claim 1, wherein residual STI through which the contact in the first FET region extends is a contact spacer.

5. The semiconductor device according to claim 1, wherein:
the first FET region is characterized in that the contact is between an n-doped FET (nFET) stack and a p-doped FET (pFET) stack, and
the second FET region is characterized in that gate dielectric is between the pFET stack and an nFET stack.

6. A method of semiconductor device fabrication, comprising:
assembling first and second field effect transistor (FET) regions that each comprise:
shallow trench isolation (STI) recessed into a substrate;
stacks of alternating semiconductor materials and bottom dielectric isolation (BDI) on the substrate aside the STI; and
gate dielectric on the STI and between the stacks;
forming a first opening through the gate dielectric to the STI in the second FET region;
forming a second opening through the gate dielectric and the STI and into the substrate in the first FET region;
filling the first and second openings with first and second dielectric material, respectively;
exposing the second dielectric material through the substrate; and
replacing the second dielectric material, which is exposed, with metal.

7. The method of semiconductor device fabrication according to claim 6, wherein:
the first FET region is characterized in that the gate dielectric is between an n-doped FET (nFET) stack and a p-doped FET (pFET) stack, and
the second FET region is characterized in that the gate dielectric is between the pFET stacks and an nFET stack.

8. The method of semiconductor device fabrication according to claim 7, further comprising layering interlayer dielectric (ILD), back end of line (BEOL) structures and a carrier substrate to the first and second FET regions opposite the substrate.

9. The method of semiconductor device fabrication according to claim 7, wherein the replacing of the second dielectric material with metal comprises:
layering interlayer dielectric (ILD) on the substrate and the STI in the second FET region; and
layering ILD on the substrate and the STI and around an exposed portion of the second dielectric material in the first FET region.

10. The method of semiconductor device fabrication according to claim 9, further comprising applying a backside signal distribution network (BSSDN) to the ILD in the first and second FET regions to contact the metal in the first FET region.

11. The method of semiconductor device fabrication according to claim 6, wherein:
two first FET regions are provided, of which one is characterized in that the gate dielectric is between n-doped FET (nFET) stacks and the other is characterized in that the gate dielectric is between p-doped FET (pFET) stacks, and
multiple second FET regions are provided, of which one is characterized in that the gate dielectric is between an nFET stack and a pFET stack.

12. The method of semiconductor device fabrication according to claim 11, wherein the one of the multiple second FET regions is between the two first FET regions.

13. A method of semiconductor device fabrication, comprising:
assembling first and second field effect transistor (FET) regions that each comprise:
shallow trench isolation (STI) recessed into a substrate;
stacks of alternating semiconductor materials and bottom dielectric isolation (BDI) on the substrate aside the STI; and
gate dielectric on the STI and between the stacks;
forming openings through the gate dielectric to the STI in the first and second FET regions;
filling the openings with dielectric material;
lithographically removing the dielectric material from the opening in the first FET region; and
filling the opening in the first FET with metal.

14. The method of semiconductor device fabrication according to claim 13, wherein:
the first FET region is characterized in that the gate dielectric is between an n-doped FET (nFET) stack and a p-doped FET (pFET) stack, and
the second FET region is characterized in that the gate dielectric is between the pFET stack and an nFET stack.

15. The method of semiconductor device fabrication according to claim 14, further comprising layering interlayer dielectric (ILD), back end of line (BEOL) structures and a carrier substrate to the first and second FET regions opposite the substrate.

16. The method of semiconductor device fabrication according to claim 14, wherein the lithographically removing the dielectric material from the opening in the first FET region comprises:
layering interlayer dielectric (ILD) on the substrate and the STI in the first and second FET regions; and
lithographically removing the ILD on the STI in the first FET region.

17. The method of semiconductor device fabrication according to claim 16, further comprising applying a backside signal distribution network (BSSDN) to the ILD in the first and second FET regions to contact the metal in the first FET region.

18. The method of semiconductor device fabrication according to claim 13, wherein:
two first FET regions are provided, of which one is characterized in that the gate dielectric is between n-doped FET (nFET) stacks and the other is characterized in that the gate dielectric is between p-doped FET (pFET) stacks, and
multiple second FET regions are provided, of which one is characterized in that the gate dielectric is between an nFET stack and a pFET stack.

19. The method of semiconductor device fabrication according to claim 18, wherein the one of the multiple second FET regions is between the two first FET regions.

* * * * *